(12) United States Patent
Gaynes et al.

(10) Patent No.: US 8,492,910 B2
(45) Date of Patent: Jul. 23, 2013

(54) UNDERFILL METHOD AND CHIP PACKAGE

(75) Inventors: Michael A. Gaynes, Yorktown Heights, NY (US); Rajneesh Kumar, Hopewell Junction, NY (US); Thomas E. Lombardi, Hopewell Junction, NY (US); Steve Ostrander, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/358,910

(22) Filed: Jan. 26, 2012

(65) Prior Publication Data

US 2012/0119353 A1 May 17, 2012

Related U.S. Application Data

(62) Division of application No. 12/538,965, filed on Aug. 11, 2009, now Pat. No. 8,129,230.

(51) Int. Cl.
*H01L 23/28* (2006.01)
(52) U.S. Cl.
USPC .... 257/795; 257/787; 257/788; 257/E21.502; 257/E23.116
(58) Field of Classification Search
USPC .......... 257/100–127, 787–795; 438/100–127
See application file for complete search history.

(56) References Cited

U.S. PATENT DOCUMENTS

| | | | |
|---|---|---|---|
| 4,186,125 | A | 1/1980 | Lundgren |
| 6,372,544 | B1 | 4/2002 | Halderman et al. |
| 6,780,923 | B2 | 8/2004 | Guha et al. |
| 6,982,492 | B2 | 1/2006 | Rumer et al. |
| 7,119,449 | B2 | 10/2006 | Workman et al. |
| 7,564,140 | B2 | 7/2009 | Lee et al. |
| 2005/0028361 | A1 | 2/2005 | Yin et al. |
| 2007/0200229 | A1 | 8/2007 | Daubenspeck et al. |
| 2008/0188038 | A1 | 8/2008 | Khaw et al. |

OTHER PUBLICATIONS

D.M. Pepper et al., Characterization of the Photo-EMF Response for Laser-Based Ultrasonic Sensing Under Simulated Industrial Conditions, CLEO, 1998, pp. 531-532.

*Primary Examiner* — Mamadou Diallo
(74) *Attorney, Agent, or Firm* — Cantor Colburn LLP; Matthew Zehrer

(57) ABSTRACT

A method of fabricating a chip package is provided. The chip package includes a laminate, a chip and conductive elements interposed between the chip and the laminate by which signals are transmitted among the chip and the laminate. The method includes dispensing a first underfill in a space defined between opposing faces of the chip and the laminate and dispensing a second underfill at least at a portion of an edge of the chip, the second underfill including a high aspect ratio material.

4 Claims, 3 Drawing Sheets

UNDERFILL METHOD AND CHIP PACKAGE

CROSS-REFERENCE TO RELATED APPLICATION

This application is a divisional of U.S. patent application Ser. No. 12/538,965, filed Aug. 11, 2009, the disclosure of which is incorporated by reference herein in its entirety.

BACKGROUND

Aspects of the present invention are directed to an underfill method and a chip package.

In the past, organic flip-chip packages have been fabricated with relatively small die sizes (i.e., <15 mm). These packages are still prevalent in industry, but there is a growing demand for packages with large die sizes (20 mm and larger). Additionally, the advancement of chip technologies from IBM's CMOS 7S to IBM's CMOS 12S technology involves the use of ultra-low K dielectrics, which are very fragile.

During thermal cycling, which is a component of most field use conditions in microelectronic applications, stresses develop due to the thermal expansion mismatch between the chip and the substrate. Historically, capillary underfill has been employed to mechanically couple the chip to the substrate, thus buffering the electrical interconnects (i.e., "controlled collapse chip connections", C4s) between chip and substrate from these stresses. The magnitude of the stresses scale with dimension of the device. At some limit, the stresses may become sufficient to cause mechanical failure of underfill, and subsequent failure of the electrical interconnects of the device (C4 fatigue failure). The stress is at its largest magnitude at corners of the die. There, the stresses beyond a critical threshold may lead to interfacial adhesive failure between the underfill and the chip surface at the corner regions of the chip (i.e., "corner delamination"), or rupture of the underfill material itself (i.e., "corner cracking"), which in turn, may propagate in several directions; through the underfill, along the interface between underfill and the edge of the chip, along the interface between underfill and the face of the chip or into the active circuitry of the chip (which may include low-K layers).

Various methods have been proposed for their ability to alleviate corner cracking. Among the methods, one option is to match the coefficient of thermal expansion (CTE) of the laminate to the chip and would involve development and implementation of a new class of low expansion laminate materials. Another method is to reduce the ability of the crack delamination to be initiated. Methods to reduce crack initiation involve the use of dicing modifications. Yet another option is to reduce overall stress levels and may involve modifying the underfill, using different laminate/lid constructions, or limiting thermal cycling conditions. Reducing the ability of a crack to propagate has also been proposed. Methods to do this include modifying the underfills to improve adhesion.

SUMMARY

In accordance with an aspect of the invention, a method of fabricating a chip package is provided. The chip package includes a laminate, a chip and conductive elements interposed between the chip and the laminate by which signals are transmitted among the chip and the laminate. The method includes dispensing a first underfill in a space defined between opposing faces of the chip and the laminate and dispensing a second underfill at least at a portion of an edge of the chip, the second underfill including a high aspect ratio material.

In accordance with an aspect of the invention, a method of fabricating a chip package is provided and includes a laminate, a chip and conductive elements interposed between the chip and the laminate by which signals are transmitted among the chip and the laminate. The method includes dispensing a second underfill at least at a corner portion of an edge of the chip, the second underfill including a high aspect ratio material and subsequently dispensing a first underfill in a space defined between opposing faces of the chip and the laminate.

In accordance with an aspect of the invention, a chip package including a laminate, a chip and conductive elements interposed between the chip and the laminate by which signals are transmitted among the chip and the laminate, is provided and includes a first underfill disposed at least within a space defined between opposing faces of the chip and the laminate and a second underfill disposed at least at a corner portion of an edge of the chip, the second underfill including a high aspect ratio material.

BRIEF DESCRIPTIONS OF THE SEVERAL VIEWS OF THE DRAWINGS

The subject matter regarded as the invention is particularly pointed out and distinctly claimed in the claims at the conclusion of the specification. The foregoing and other aspects, features, and advantages of the invention are apparent from the following detailed description taken in conjunction with the accompanying drawings in which:

DETAILED DESCRIPTION

In accordance with aspects of the present invention, underfill methods and structures are provided that mitigate crack and corner crack propagation and thus enable, for example, large die, low-K flip chip plastic ball grid array (FCPBGA) modules to be reliably fabricated. The methods and structures utilize an improved fracture toughness underfill material, which contains a high aspect ratio material, such as fibers, continuous fibers and/or whiskers, in the matrix, which may be resin, epoxy or some other suitable material. The high aspect ratio material absorbs stress and mitigates crack propagation.

Figure 1A:
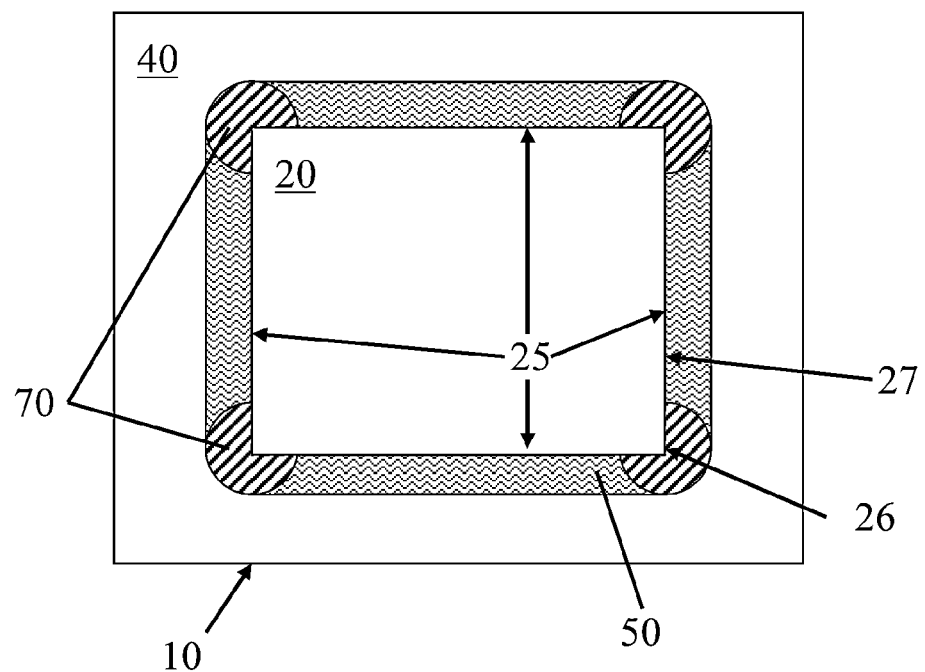
FIG. 1A is a top view of a chip package in accordance with embodiments of the invention.
Figure 1B:
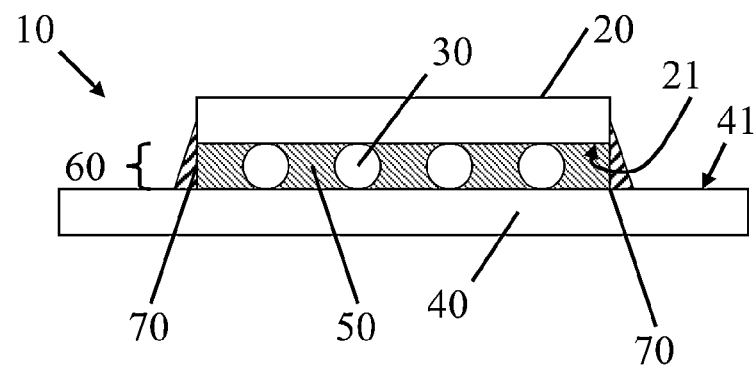
FIG. 1B is an elevation view of a chip package in accordance with embodiments of the invention.

With reference to FIGS. 1A and 1B, a typical bond and assembly process for a chip package 10, such as an FCPBGA, begins with a chip placement operation. Here, a chip 20, such as a microprocessor, is placed in contact with solder bumps 30 that are arrayed on a face 41 of a laminate 40. The solder bumps 30 may be controlled collapse chip connection (C4) bumps or some other similar components. Following chip placement, the chip 20, the solder bumps 30 and the laminate 40 are heated during a furnace reflow operation to a temperature at which the solder bumps 30 melt and adhere to leads on the chip 20 and the laminate 40. The solder bumps 30, therefore, are disposed to act as conductive elements by which signals are transmittable between the chip 20 and the laminate 40. Following the furnace reflow, flux cleaning and optionally plasma ashing are employed to clean the chip 20, the solder bumps 30 and the laminate 40. At this point, underfill(s) are dispensed between the face 21 of the chip 20 and the laminate face 41 as well as around the chip 20, as will be described below. The underfill(s) is/are then cured by way of heating operations, UV exposure and/or other similar processes.

Still referring to FIGS. 1A and 1B, a method of fabricating the chip package 10, which includes the chip 20, the solder bumps 30 and the laminate 40, includes dispensing a first underfill 50, which is characterized in FIG. 1B with top left to bottom right cross-hatching, in a space 60 defined between the opposing faces 21 and 41 of the chip 20 and the laminate 40. The method further comprises dispensing a second underfill 70, which is characterized in FIGS. 1A and 1B with bottom left to top right cross-hatching, at least at a portion of an edge 25 of the chip 20. The second underfill 70 includes a high aspect ratio material 80 (see FIG. 2).

The dispensing of the first underfill 50 in the space 60 may include a capillary underfill dispensing operation in accordance with known methods. As such, the material of the first underfill 50 should be selected from a group of underfill materials that have rheological flow characteristics that are appropriate for capillary underfill dispensing. That is, the first underfill 50 must be able to flow through the space 60 and around the solder bumps 30 and/or any other components within the space 60 such that, e.g., air pockets do not form.

The dispensing of the second underfill 70 may include a fillet pass dispensing operation in accordance with known methods. That is, the second underfill 70 is dispensed at least at the portion of an edge 25 of the chip 20 to form fillets of the second underfill 70. In an embodiment, the fillets may have various cross-sectional shapes, such as conical or other similar cross-sectional shapes. In further embodiments of the invention, the portion of the edge 25 includes at least a corner 26 of the chip 20. In an optional embodiment, the fillet pass dispensing operation may be further conducted as an edge fillet pass dispensing operation to dispense the first underfill 50 and/or the second underfill 70 along the straight portion 27 of the edge 25. Since the edge fillet pass operation can include a dispensing of the first underfill 50 and/or the second underfill 70, the underfill here is characterized with wavy cross-hatching.

Figure 2:
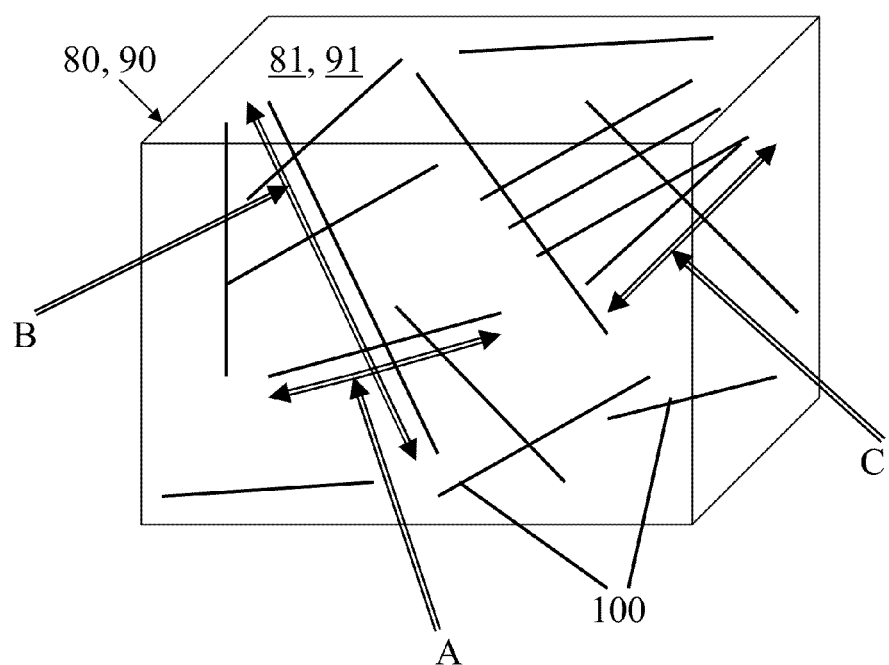
FIG. 2 is a perspective view of an underfill including a high aspect ratio material in accordance with embodiments of the invention.

While the second underfill 70 has been described above as including a high aspect ratio material 80, it is noted that the first underfill 50 may also include the same or another high aspect ratio material 90 (see FIG. 2). In this case, the high aspect ratio material 90 of the first underfill 50 must not inhibit the viscosity or the flow characteristics of the first underfill 50. Moreover, the high aspect ratio materials 80 and 90 of the first and second underfills 50 and 70 need not be the same materials.

Both the first and the second underfills 50 and 70 may further include spherical random and/or any other shaped particles within their respective matrices 81 and 91. Similarly, both the first and the second underfills 50 and 70 may be further provided with adhesion promoters. The adhesion promoters may be used to enhance adhesion of the high aspect ratio material to the respective matrices 81 and 91, to enhance adhesion of the first and second underfills 50 and 70 to one another and/or to enhance adhesion of the first and second underfills 50 and 70 to the chip and laminate faces 21 and 41.

Given that the second underfill does not have the same rheological flow requirements for capillary underfill dispense processing, the second underfill may be formulated with significantly higher solids loading of the filler material than the first underfill material. In accordance with aspects of the present invention, the second underfill may also be formulated from the identical materials used in the first underfill, but with a ratio of ingredients adjusted to optimize for mechanical properties rather than capillary flow. Likewise the second underfill ingredients maybe an incomplete subset of the first, or visa-versa.

With reference to FIG. 2, the high aspect ratio material 80 or 90 includes fibers 100, such as whiskers, fibers and/or continuous fibers, which are distributed throughout the respective matrices 81 or 91. The fibers 100 are characterized as having a relatively high aspect ratio of length to width/thickness. In embodiments of the invention, the relatively high aspect ratio may be at least about 1.1:1. In a typical case, the aspect ratio may be about 10:1 where the lengths of the fibers 100 are about 10 microns and their thicknesses are about 1 micron. It is also possible that the fibers 100 could have a far more radically high aspect ratio. That is, the fibers 100 may be, e.g., nanotubes or some other similar type of relatively long and extremely thin fiber. The amount of the fibers 100 in the matrices 81, 91 may be about 1-50% by volume or higher and about 5-10% or 10% by volume in particular cases.

The material of the matrices 81, 91 may by a resin or epoxy that is curable by way of heating, UV exposure or other similar methods. Where the first and second underfills 80, 90 include different matrices, it will be understood that the matrix materials should be compatible with one another. The fibers 100 may be formed of poly or single crystal ceramic, glass, polymeric material and/or metallic material. In particular embodiments, the fibers 100 may be formed of glass that allows for an adjustment of the coefficient of thermal expansion (CTE) of the fibers 100. In further embodiments, the fibers 100 may be treated with adhesion promoters to facilitate relatively wide dispersion of the fibers 100 within the matrices 81, 91 while still allowing for appropriate underfill viscosities.

As a general matter, the choice of the materials and exact composition for the first and second underfills 50 and 70, the matrices 81, 91, the fibers 100 and the adhesion promoters can be made to depend on the relative compatibilities of each, CTE adjustments, costs and manufacturability of the desired applications.

The presence of the fiber 100 in the second underfill 70 and/or the first underfill 50 will increase the fracture toughness of the underfill, as well as the strength and modulus of its materials. Increasing the fracture toughness is relatively important, since increased fracture toughness will enable the underfill to be relatively more resistant to crack propagation than it would otherwise be. As such, with respect to the use of the fibers 100 in an FCPBGA case, as an example, the resulting structure will be an underfilled FCPBGA assembly which is relatively highly resistant to corner crack propagation.

As shown in FIG. 2, the resistance to crack propagation arises from the fact that cracks A, B and C will be deflected around the individual fibers 100 and through matrix 81, 91, e.g., resin or epoxy. That is, as a crack propagates through the underfill 50, 70, the crack will be deflected at the fiber 100/matrix 81, 91 interface. The propagation of the crack is, thus, momentarily halted by the fiber 100 and then deflected along the interface causing interfacial shear and lateral contraction of the fiber 100. This may result in debonding and crack deflection along the interface and, thus, may distribute and/or absorb a significant portion of the stress associated with the crack. This will prevent the propagation of the crack further into the underfill 50, 70 and likely prevent it from reaching the chip 20 within an expected package lifetime.

Figure 3:
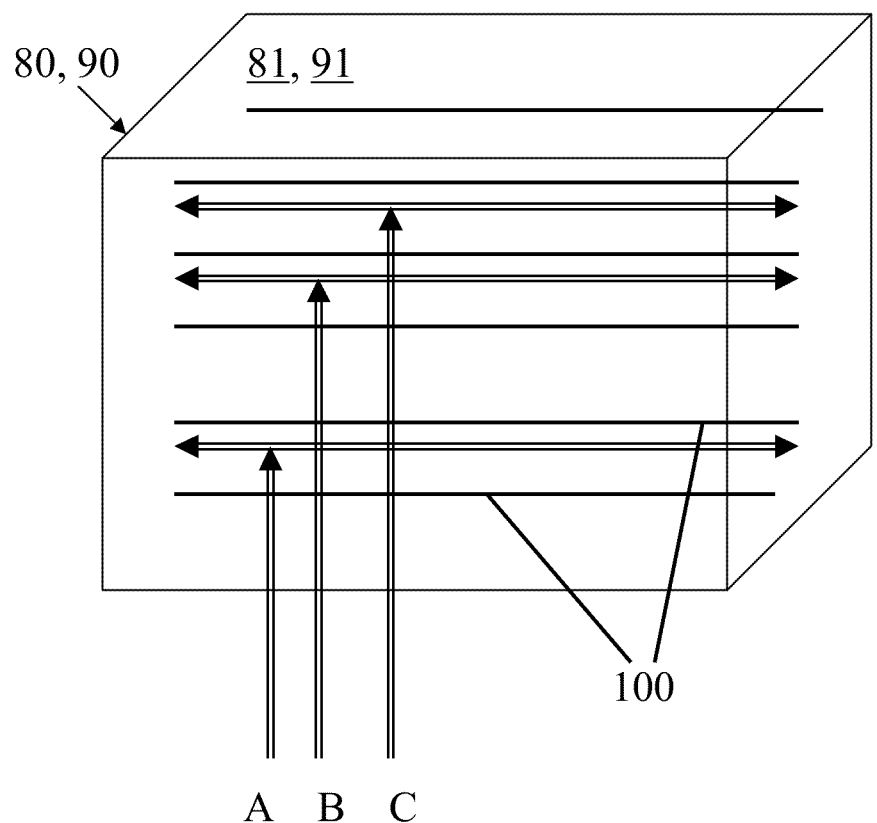
FIG. 3 is a perspective view of an underfill including a high aspect ratio material in accordance with embodiments of the invention.

In accordance with aspects of the invention, the resistance to crack propagation described above is optimized where the cracks encounter fibers 100 that are oriented substantially perpendicularly with respect to the directions of crack propagation. However, in many cases, crack propagation directions are highly randomized and, therefore, an attitude and orientation of an individual crack cannot be accurately predicted. In these cases, the fibers 100 would be distributed through the matrices 81, 91 with relatively standard aspect ratios (i.e., about 10 microns in length to about 1 micron in thickness) with similarly randomized attitudes and orientations. In this way, the likelihood that a particular fiber 100 will be provided along the propagation direction of a particular crack will be increased. Where crack propagation directions are predictable, on the other hand, as shown in FIG. 3, the fibers 100 can be made relatively long and oriented so as to be substantially perpendicular with the known crack propagation directions.

In accordance with another aspect of the invention, the method of fabricating the chip package 10, as described above, may include dispensing the second underfill 70 first. Here, the dispensing of the second underfill 70 is performed at the corner portion 26 of the edge 25 of the chip 20 and, again, the second underfill 70 includes the high aspect ratio material 80. The method further includes subsequently dispensing the first underfill 50 in the space 60, as described above.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the disclosure not be limited to the particular exemplary embodiment disclosed as the best mode contemplated for carrying out this disclosure, but that the disclosure will include all embodiments falling within the scope of the appended claims.

What is claimed is:

1. A chip package including a laminate, a chip and conductive elements interposed between the chip and the laminate by which signals are transmitted among the chip and the laminate, the chip package comprising:
    a first underfill disposed at least within a space defined between opposing faces of the chip and the laminate; and
    a second underfill disposed at least at a corner portion of an edge of the chip, the second underfill including a high aspect ratio material,
    wherein the high aspect ratio material comprises fibers, distributed through a matrix, which are characterized as having a relatively high aspect ratio of length to width and thickness.

2. The chip package according to claim 1, wherein the first underfill includes a high aspect ratio material.

3. The chip package according to claim 1, wherein the relatively high aspect ratio of length to width and thickness is at least about 10:1.

4. The chip package according to claim 1, wherein the fibers are distributed through the matrix with random and/or preselected orientations.

* * * * *